US010764989B1

(12) United States Patent
Lui et al.

(10) Patent No.: US 10,764,989 B1
(45) Date of Patent: Sep. 1, 2020

(54) THERMAL ENHANCEMENT OF EXPOSED DIE-DOWN PACKAGE

(71) Applicant: Dialog Semiconductor (UK) Limited, London (GB)

(72) Inventors: Tung Ching Lui, Teck (DE); Baltazar Canete, Waiblingen (DE); Rajesh Aiyandra, Denkendorf (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/363,556

(22) Filed: Mar. 25, 2019

(51) Int. Cl.
| | |
|---|---|
| *H05K 1/02* | (2006.01) |
| *H05K 7/20* | (2006.01) |
| *H05K 1/11* | (2006.01) |
| *H01L 23/373* | (2006.01) |
| *H01L 23/473* | (2006.01) |
| *H05K 1/18* | (2006.01) |

(52) U.S. Cl.
CPC ......... *H05K 1/0209* (2013.01); *H01L 23/373* (2013.01); *H01L 23/473* (2013.01); *H05K 1/111* (2013.01); *H05K 1/181* (2013.01); *H05K 7/2029* (2013.01); *H05K 2201/10734* (2013.01)

(58) Field of Classification Search
CPC .................................................. H05K 1/0209
See application file for complete search history.

(56) References Cited

U.S. PATENT DOCUMENTS

| 5,319,242 | A | 6/1994 | Camey et al. | |
|---|---|---|---|---|
| 7,221,055 | B2 | 5/2007 | Lange | |
| 7,355,276 | B1 * | 4/2008 | Lanciault | H01L 24/32 257/706 |
| 8,080,871 | B2 * | 12/2011 | Dangelo | B82Y 10/00 257/706 |
| 8,310,067 | B2 | 11/2012 | Zhao et al. | |
| 8,531,841 | B2 * | 9/2013 | Lee | H05K 7/209 174/252 |
| 10,008,475 | B2 | 6/2018 | Chiu | |
| 10,083,939 | B2 | 9/2018 | Seo et al. | |
| 10,386,898 | B2 * | 8/2019 | Siddiqui | G06F 1/203 |
| 2006/0091562 | A1 * | 5/2006 | Lee | H01L 23/3675 257/778 |
| 2006/0175710 | A1 * | 8/2006 | Xie | H01L 21/50 257/778 |
| 2006/0220225 | A1 | 10/2006 | Ni | |
| 2013/0062760 | A1 | 3/2013 | Hung et al. | |
| 2013/0093073 | A1 | 4/2013 | Chen | |
| 2013/0208426 | A1 * | 8/2013 | Kim | H01L 25/0657 361/717 |
| 2014/0368992 | A1 | 12/2014 | Strader et al. | |
| 2016/0035645 | A1 | 2/2016 | Olsen et al. | |

(Continued)

OTHER PUBLICATIONS

German Office Action, File No. 10 2019 209 994.7, Applicant: Dialog Semiconductor (UK) Limited, dated Mar. 27, 2020, 6 pages.

*Primary Examiner* — William Coleman
(74) *Attorney, Agent, or Firm* — Saile Ackerman LLC; Stephen B. Ackerman; Rosemary L. S. Pike

(57) ABSTRACT

An integrated circuit package having excellent heat dissipation is described. An integrated circuit die is attached to a substrate and the substrate is mounted on a printed circuit board (PCB) wherein there is a gap between a surface of the die facing the PCB and the PCB. A thermal enhanced layer is formed within the gap wherein heat travels from the die through the thermal enhanced layer to the PCB.

18 Claims, 8 Drawing Sheets

(56) References Cited

U.S. PATENT DOCUMENTS

| | | |
|---|---|---|
| 2016/0247742 A1 | 8/2016 | Vadhavkar et al. |
| 2016/0268190 A1 | 9/2016 | McKnight-Macneil et al. |
| 2016/0351530 A1* | 12/2016 | Gandhi .................. H01L 24/81 |
| 2017/0345744 A1 | 11/2017 | Olsen |
| 2018/0323118 A1* | 11/2018 | Wang ....................... H01L 23/04 |
| 2019/0317285 A1* | 10/2019 | Liff ....................... G02B 6/2938 |

\* cited by examiner

THERMAL ENHANCEMENT OF EXPOSED DIE-DOWN PACKAGE

(1) TECHNICAL FIELD

This disclosure is related to integrated circuit packages, and more particularly, to improving heat dissipation in integrated circuit packages.

(2) BACKGROUND

The recent advancement in high-performance semiconductor packages has been driven by the need for higher pin count and superior heat dissipation. By encapsulating the die with a molding compound and leaving the die top exposed (chip with face-down or die-down configuration), this package is thus less rigid under thermal loading and solder joint reliability enhancement is expected. Methods to improve heat dissipation in the die-down package configuration are desired.

Several U.S. patents discuss thermal interface materials, including U.S. Pat. No. 10,083,939 (Seo et al), U.S. Pat. No. 8,310,067 (Zhao et al), and U.S. Pat. No. 10,008,475 (Chiu) and U.S. Patent Application 2014/0368992 (Strader et al). Some other patents discuss heat dissipation methods, including U.S. Pat. No. 7,221,055 (Lange) and U.S. Patent Applications 2017/0345744 (Olsen), 2016/0268190 (Mcknight-MacNeil et al), 2016/0247742 (Vadhavkar et al), and 2016/0035645 (Olsen et al). Other patents teach die attach methods, including U.S. Pat. No. 5,319,242 (Carney et al) and U.S. Patent Application 2013/0062760 (Hung et al).

SUMMARY

It is the primary objective of the present disclosure to provide excellent heat dissipation in a die-down integrated circuit (IC) package.

Yet another objective is to provide multiple heat dissipation paths in a die-down IC package.

A further objective is to provide multiple heat dissipation paths in a die-down IC package, wherein one thermal path is through the die to the substrate, through connectors to the printed circuit board (PCB) underlying the die, and wherein another thermal path is from the die through a thermal enhanced layer directly to the PCB.

A still further objective is to provide multiple heat dissipation paths in a die-down IC package without a heat spreader.

In accordance with the objectives of the present disclosure, an integrated circuit package having superior heat dissipation is achieved. An integrated circuit die is attached to a substrate and the substrate is mounted on a printed circuit board (PCB) wherein there is a gap between a surface of the die facing the PCB and the PCB. A thermal enhanced layer is formed within the gap wherein heat travels from the die through the thermal enhanced layer to the PCB.

Also in accordance with the objectives of the present disclosure, a method of fabricating an integrated circuit package having superior heat dissipation is achieved. An integrated circuit die attached to a substrate is provided. The substrate is mounted on a printed circuit board (PCB) wherein there is a gap between a surface of the die facing the PCB and the PCB. A thermal enhanced layer is formed within the gap wherein heat travels 1) from the die to the substrate through connectors to the PCB and 2) from the die through the thermal enhanced layer to the PCB.

BRIEF DESCRIPTION OF THE DRAWINGS

In the accompanying drawings forming a material part of this description, there is shown.

DETAILED DESCRIPTION

Figure 1A:
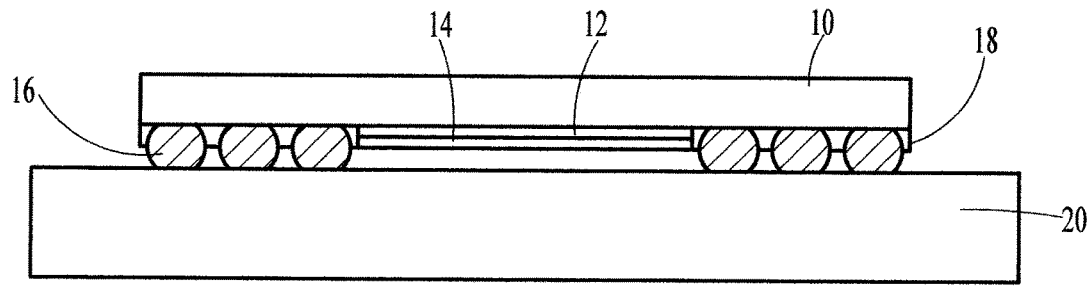
FIGS. 1A and 1B are cross-sectional representations of a die-down package of the prior art.
Figure 1B:
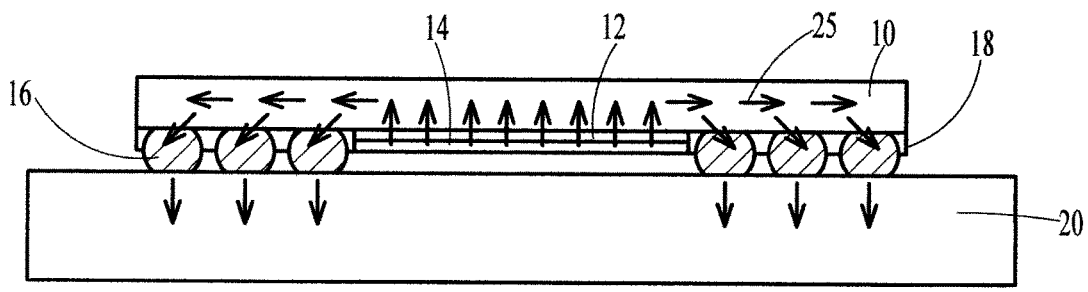

The present disclosure discusses ways to enhance thermal performance in die-down IC packages. Finite-element simulations have been employed for the study of package thermal performance. An example exposed die package is illustrated in FIG. 1A. The package has a connector layer 12 which is located between the die 14 active surface and a substrate 10. The connector 12 could be a material such as solder joints, copper pillars, etc. There is an air gap between the die 14 and the PCB 20. When the package powers up, the die will start heating and generating junction temperature ($T_j$). This junction temperature will dissipate from the die 14 to the connector 12, the substrate 10, solder joints 16, and then to the printed circuit board (PCB) 20, as shown by arrows 25 in FIG. 1B.

Figure 2A:
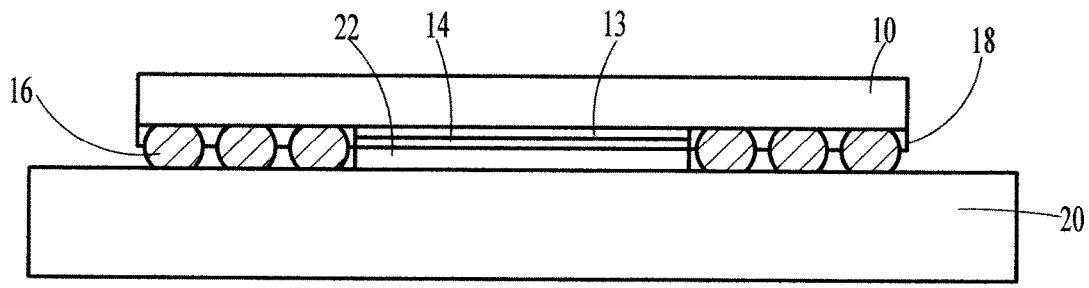
FIGS. 2A and 2B are cross-sectional representations of a die-down package of the present disclosure.
Figure 2B:
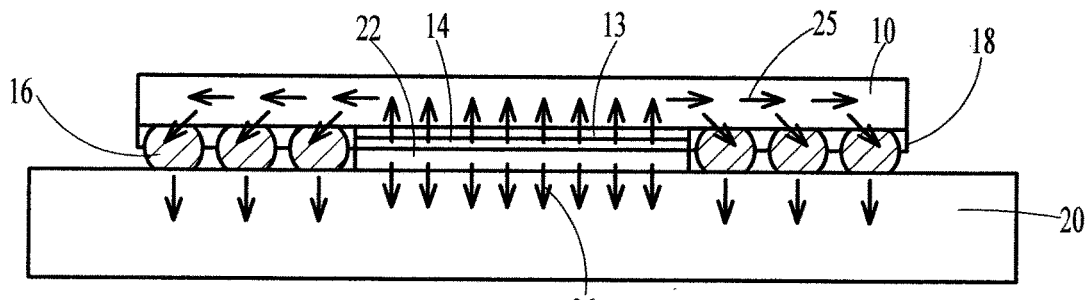

The present disclosure provides an improved exposed die package, illustrated in FIGS. 2A and 2B. As shown in FIG. 2A, in the gap between the die 14 exposed surface and the PCB 20, a thermal enhanced layer 22 is applied. This thermal enhanced layer 22 allows the heat to have an extra thermal path where heat is directly transferred from the backside of the die (exposed die surface) to the PCB, as shown by arrows 26 in FIG. 2B. This thermal enhanced layer 22 supports the extra and significant heat path 26 to remove the heat from the die in addition to the heat path 25 through connector 12 to the substrate 10, solder joints 16, and then to the PCB 20. Because of the additional heat dissipation path, the package according to the present disclosure can handle higher power input with the same package size and structure. The connector 13 between the die 14 active surface and the substrate 10 needs to be a material that can transfer electricity, signals, etc.

The thermal enhanced layer 22 is not limited to film type, shape, or material properties. It can be glue, a gap pad, phase change material, paste, solder or metal joints, etc. It would be advantageous for the thermal enhanced layer to be high in thermal conductivity, but this is not required. Any value of thermal conductivity can help the package further reduce junction temperature. The major advantage of the thermal enhanced layer of the present disclosure is that the package structure does not need to be modified or re-designed to apply this thermal enhanced layer. The thermal enhanced layer can be applied or not, according to the situation and application.

Four preferred embodiments of the process of the present disclosure are described. It will be obvious that the thermal enhanced layer of the present disclosure can be applied using current manufacturing processes without additional investment or equipment modification.

Figure 3:
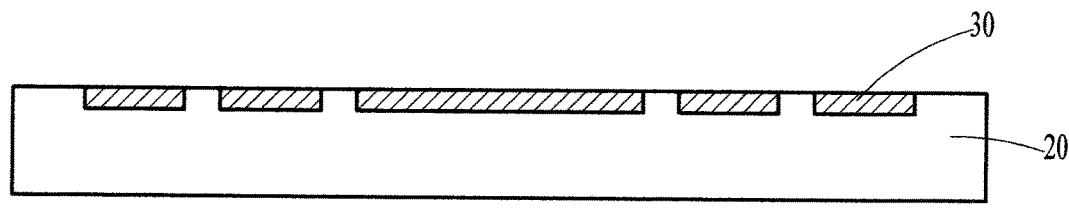
FIGS. 3-6 are cross-sectional representations of a process to fabricate a first preferred embodiment of the die-down package of the present disclosure.
Figure 4:
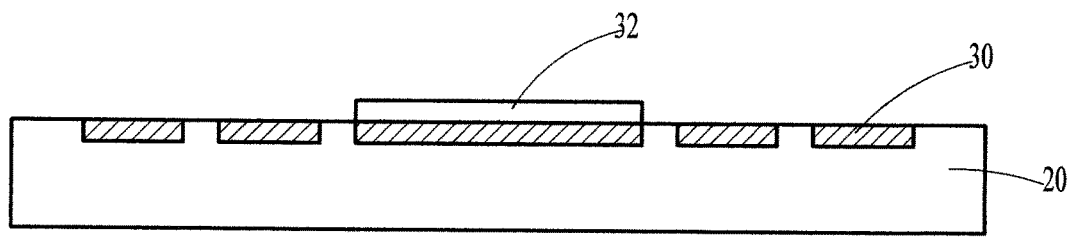
Figure 5:
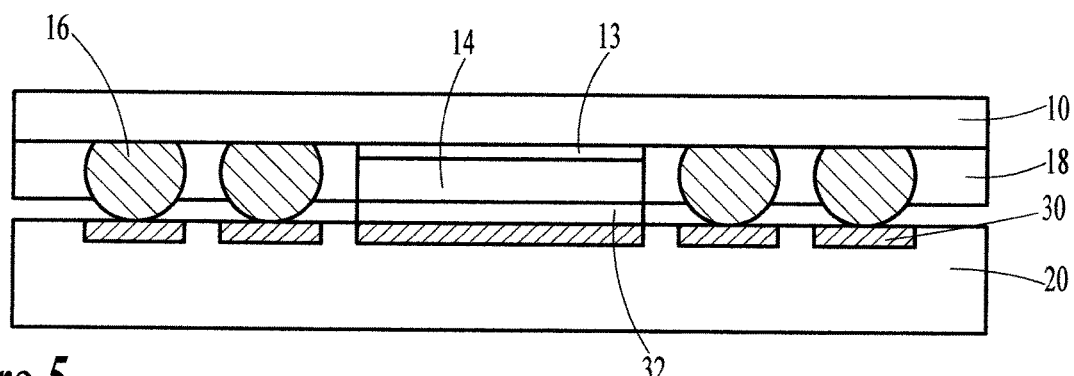

The first preferred embodiment of the present disclosure will be described with reference to FIGS. 3-6. Referring now more particularly to FIG. 3, there is shown a PCB 20. Copper pads 30 have been formed on the surface of the PCB. A phase change material pad 32 is applied to a copper pad 30 on the PCB, as shown in FIG. 4. The phase change material is applied as solid pads 32 at room temperature on the PCB. It is easy to handle phase change material at room temperature with custom dimensions or shapes. After applying the phase change material pad 32 on the PCB, the integrated circuit (IC) package is placed on the top of the PCB using surface mount technology, as shown in FIG. 5. Solder joints 16 will connect to contact pads 30 on the PCB. The die 14 will contact the phase change material pad 32. Die 14 is surrounded by molding compound 18. Instead of solder joints 16, the substrate 10 may be attached to the PCB using die attach material, phase change material, die attach film, and so on.

Figure 6:
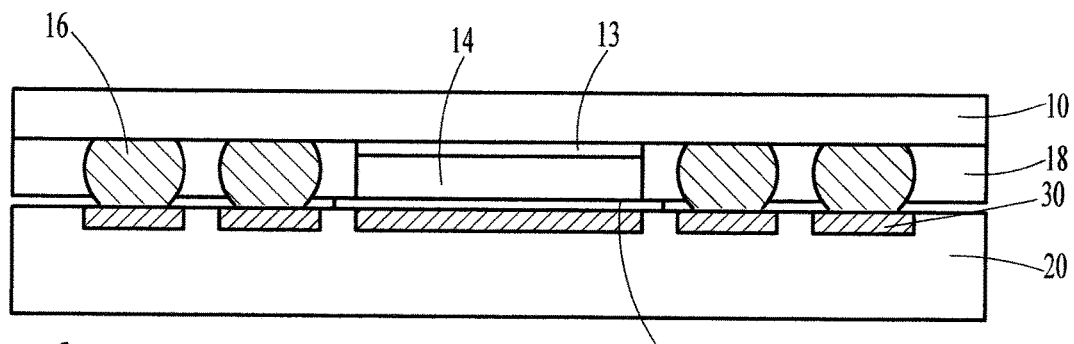

Some phase change materials have melting temperatures of between 0° C. to 260° C. The phase change material changes phase during the reflow process where solder joints 16 mount on the PCB. During the reflow, the phase change material will change from a solid state to a liquid state. This liquid phase will have a distinct viscosity depending on the material properties, pressure, and assembly orientation. After the reflow process, as shown in FIG. 6, the phase change material will be thinner and will enable thermal conductivity between the IC package and the PCB.

Figure 7:
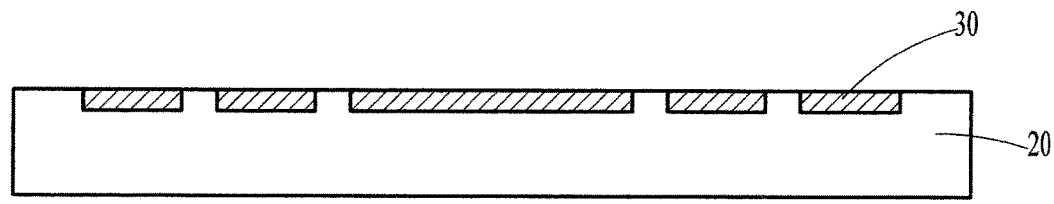
FIGS. 7-10 are cross-sectional representations of a process to fabricate a second preferred embodiment of the die-down package of the present disclosure.
Figure 8:
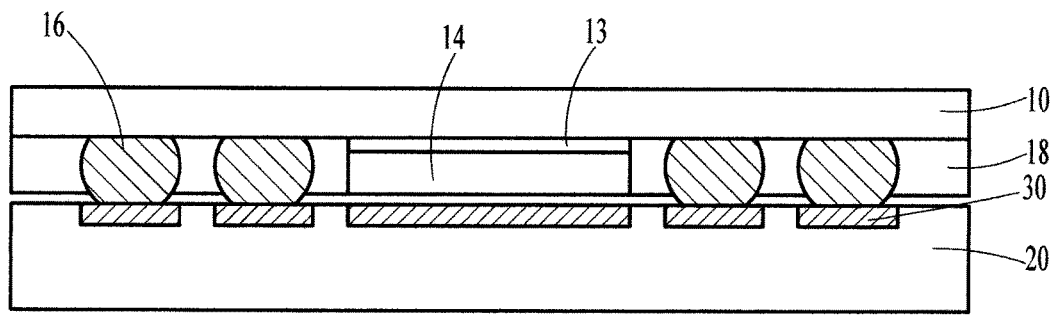
Figure 9:
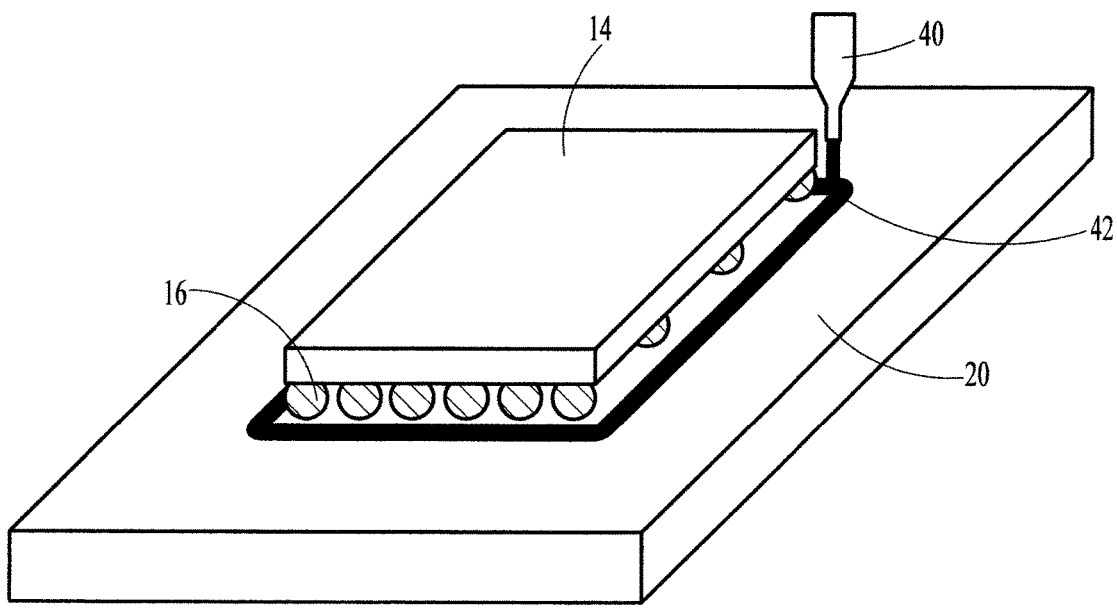
Figure 10:
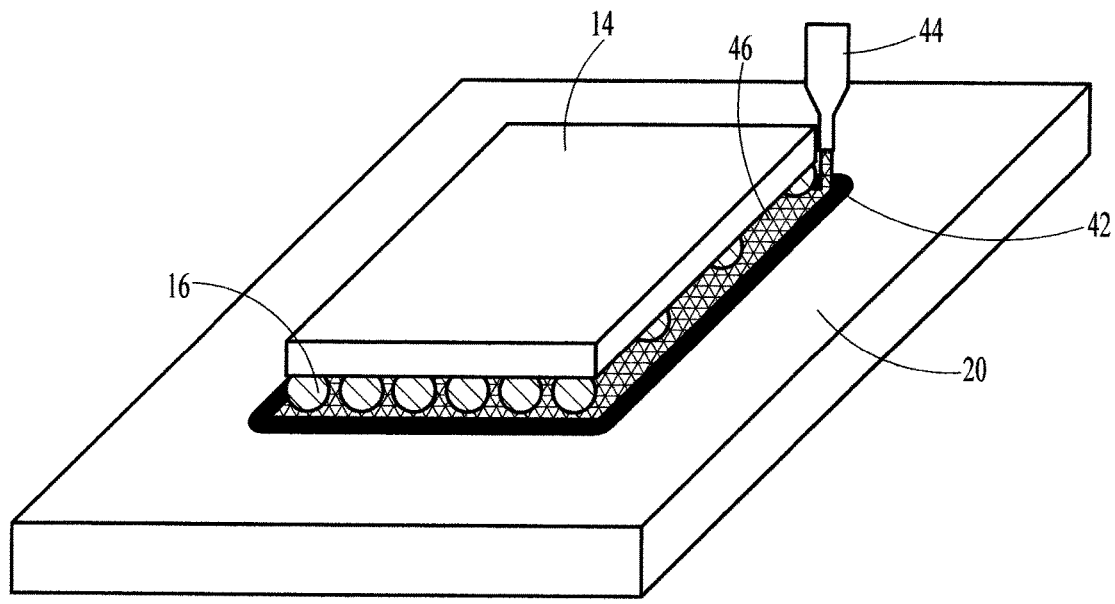

A second preferred embodiment of the present disclosure will be described with reference to FIGS. 7 through 10. Referring now more particularly to FIG. 7, there is shown a PCB 20. Copper pads 30 have been formed on the surface of the PCB. Next, the IC package is surface mounted on the PCB by solder joints 16, for example, using a reflow process, as shown in FIG. 8. In this embodiment, epoxy will form the thermal enhanced layer. As shown in FIG. 9, a high-viscous epoxy 42 is dispensed 40 around the package to create a barrier or dam. The high-viscous epoxy 42 can have a viscosity of between about 300,000 to 1,000,000 mPa·s and can enter into a small gap. The dam/barrier height is dependent on the standoff height of the solder joints 16 or the gap between the exposed die-down 14 and the PCB 20. Next, as shown in FIG. 10, low-viscous epoxy 46 is dispensed 44 inside the dam/barrier 42. The viscosity of the low-viscous epoxy 46 can be between about 500 to 700 mPa·s and it is suitable for the larger gap between the die and the PCB. Next, the high- and low-viscous epoxy are cured by heating or by remaining at room temperature for a certain time such as 24 hours. The low-viscous epoxy 46 will fill up the gap between the exposed die 14 and the PCB 20, generating the second thermal path.

Figure 11:
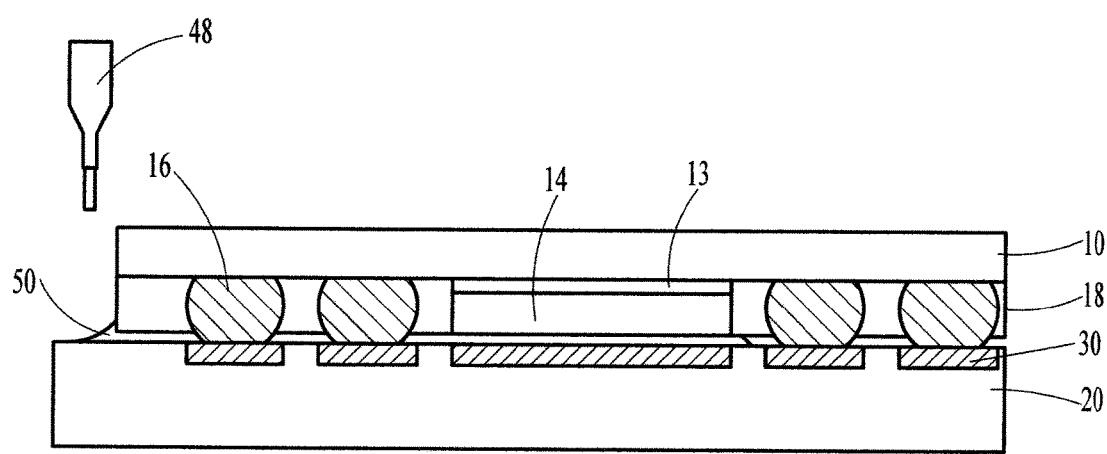
FIG. 11 is a cross-sectional representation of a step in the process to fabricate a third preferred embodiment of the die-down package of the present disclosure.

In a third preferred embodiment of the present disclosure, illustrated in FIG. 11, low-viscous epoxy 50 is dispensed 48 to fill the gap between the package 10 and the PCB 20. The thermal enhanced material 50 is coated around the IC package after mounting and this thermal enhanced material penetrates into the gap between the package and the PCB by capillary forces by the process of heat curing. The low viscous epoxy 50 will fill up the gap between the exposed die 14 and the PCB 20, generating the second thermal path.

Figure 12:
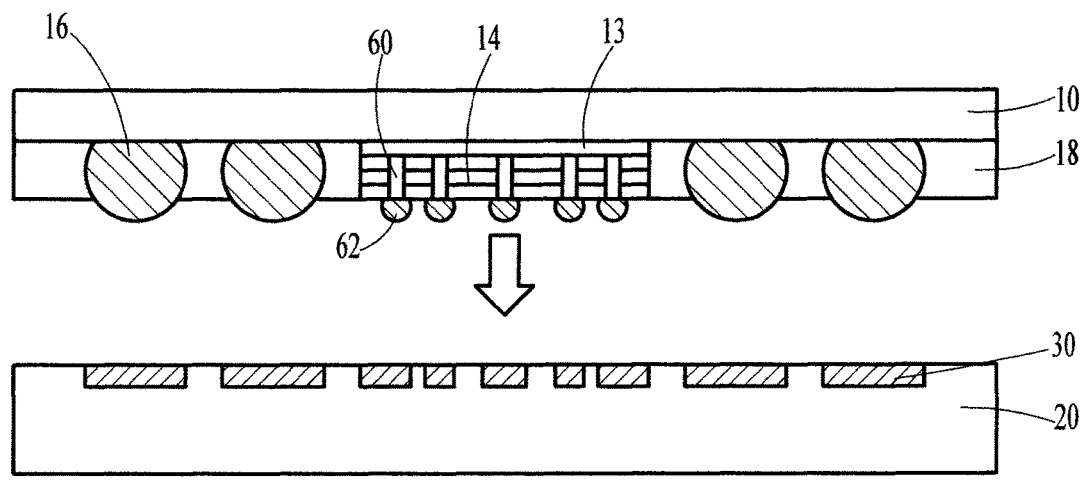
FIGS. 12-13 are cross-sectional representations of a steps in the process to fabricate a fourth preferred embodiment of the die-down package of the present disclosure.
Figure 13:
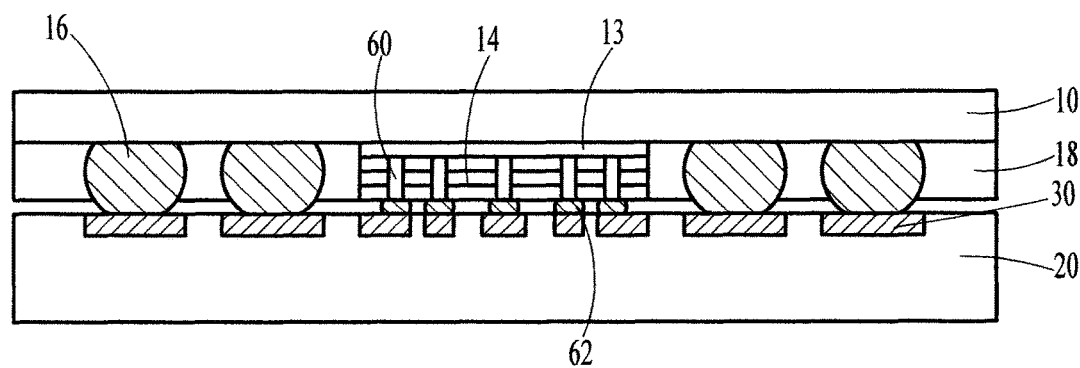

The fourth preferred embodiment of the present disclosure is illustrated in FIGS. 12 and 13. In the IC package, as shown in FIG. 12, through-silicon vias (TSV) 60 have been formed through the die 14 and filled with conductive material such as solder, forming vertical electrical connections through the die. Thermal enhanced material can be used to create a thermal connection between the TSV and the PCB by placing a conductive material such as solder paste on the PCB (not shown) or solder joints 62 on the TSV's on the die. Other conductive material such as copper or tin can be used in place of the solder. After the package is surface mounted onto the PCB, during the reflow process for the solder joints 16, this solder paste/solder joint 62 will melt and generate a thermal path between the die and the PCB, as shown in FIG. 13.

Figure 14:
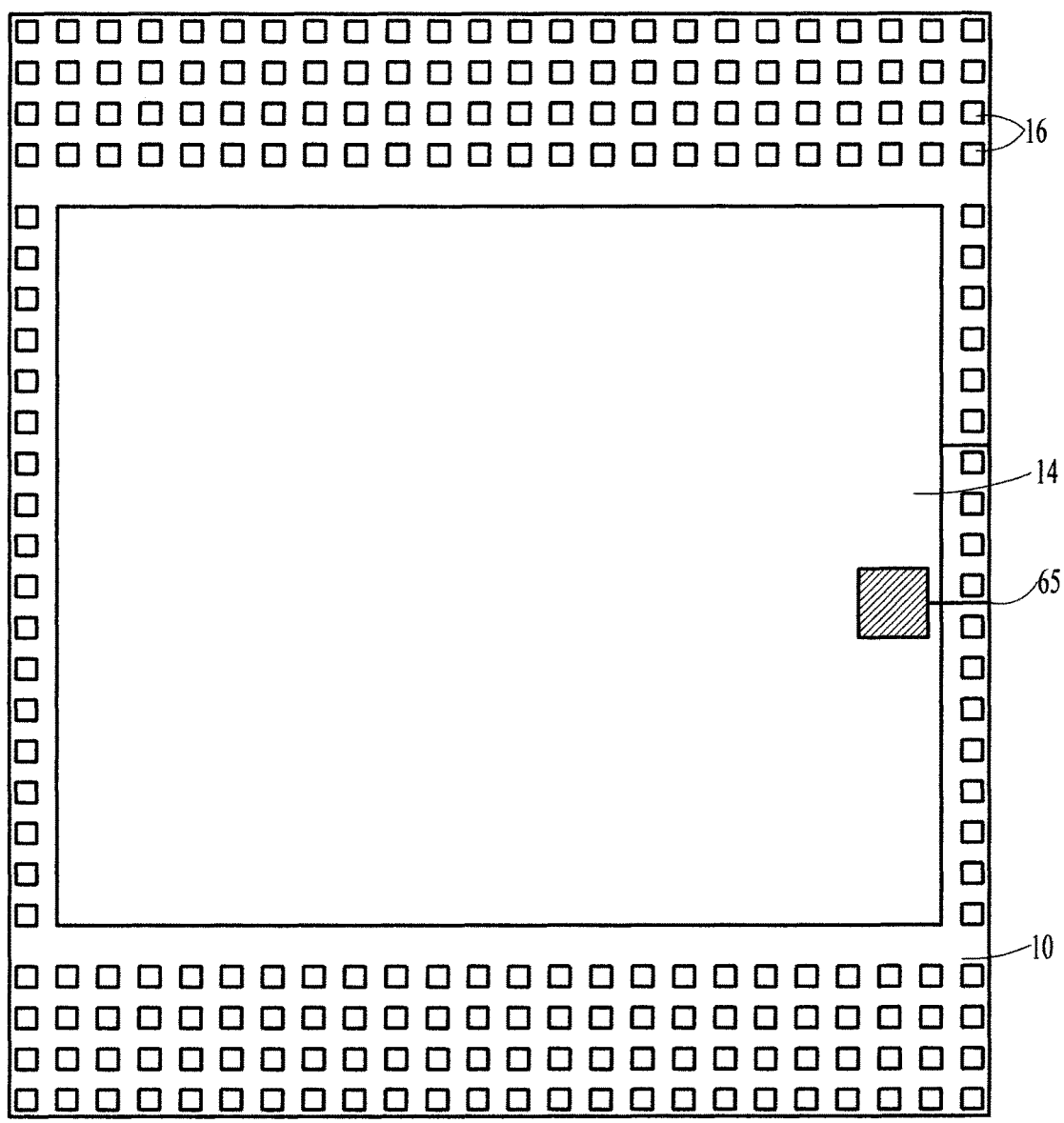
FIG. 14 is a top view of a test simulation of the die-down package of the present disclosure.

A thermal simulation was carried out to study the effect of thermal conductive material applied on an exposed die. A System-in-Package (SiP) was studied, having a package size of 8.105×8.61×0.805 mm$^3$. The package 10, as shown in FIG. 14, was mounted on a 4-layer JEDEC standard board operating at an ambient temperature of 25° C. The die 14 was embedded inside the package. The power input area 65 was 0.411×0.482 mm$^2$ on the die surface. In this example, the total power dissipation was 1 W located in one hot spot (power input) area 65 at one side of the package.

The junction temperature of the original SiP was 81.7° C. With different values of conductive material properties, the junction temperature was reduced from 81.7° C. to 69.1° C., 61.5° C. and 56.9° C. with 0.4 W/m.K, 1.2 W/m.K and 2.5 W/m.K respectively. The difference is 6.4° C. Looking at the thermal contour of the simulation, we can see that the heat from the SiP with conductive material progressed towards both the PCB and the substrate. This is due to the parallel combination of connector and conductive material. That is, the SiP has better heat dissipation performance because of the thermal conductive material between the PCB and the die. It provides an extra pathway for removing heat from the die.

With little effort, the 6.4° C. difference in cooling seen in the simulation described above can be easily extended to provide about a 10 to 25° C. cooler package with different thermal conductivity properties of the thermal conductive material layer. Thus, higher power input can be applied to the package to meet customers' requirements.

Figure 15:
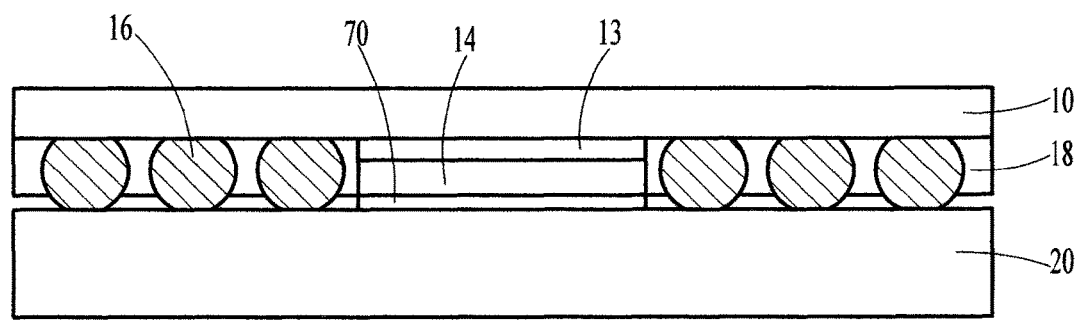
FIGS. 15-17 are cross-sectional representations of alternative ball grid array (BGA) die-down packages of the present disclosure.
Figure 16:
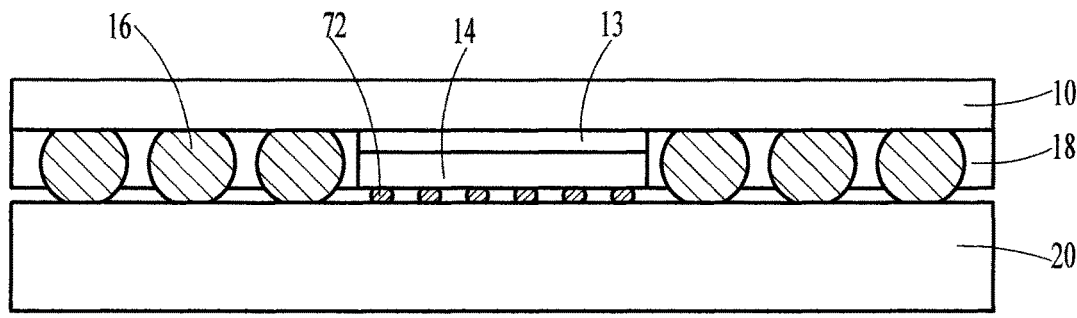
Figure 17:
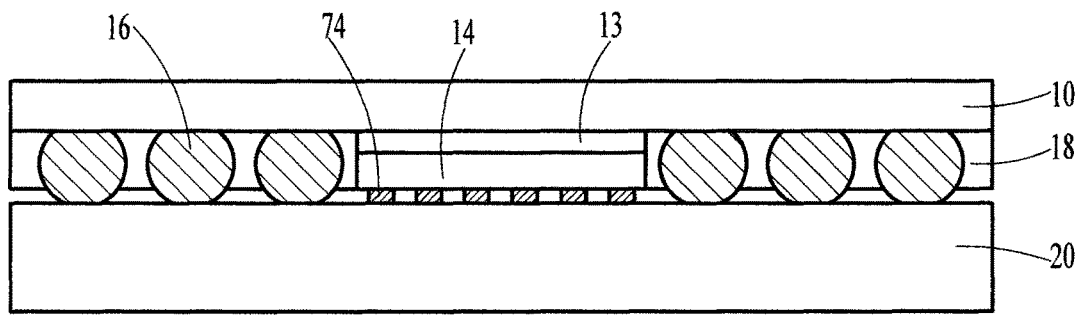

FIGS. 15-20 illustrate some possible variations of the thermal enhanced layer of the present disclosure in different IC package types. FIGS. 15-17 illustrate a ball grid array (BGA) package. In FIG. 15, a conductive material 70 fills the gap between the die 14 and the PCB 20 creating a second thermal path. The conductive material 70 is a paste or film style material such as a phase change material as described in the first embodiment.

FIG. 16 illustrates a BGA package where conductive material 72 in sphere shapes bridges the gap between the die and the PCB, creating a second thermal path. Conductive material 72 may be solder joints or copper pillars, for example, as in the fourth embodiment. FIG. 17 illustrates a similar BGA package where conductive material in pillar shapes 74 bridges the gap between the die and the PCB, creating a second thermal path.

Figure 18:
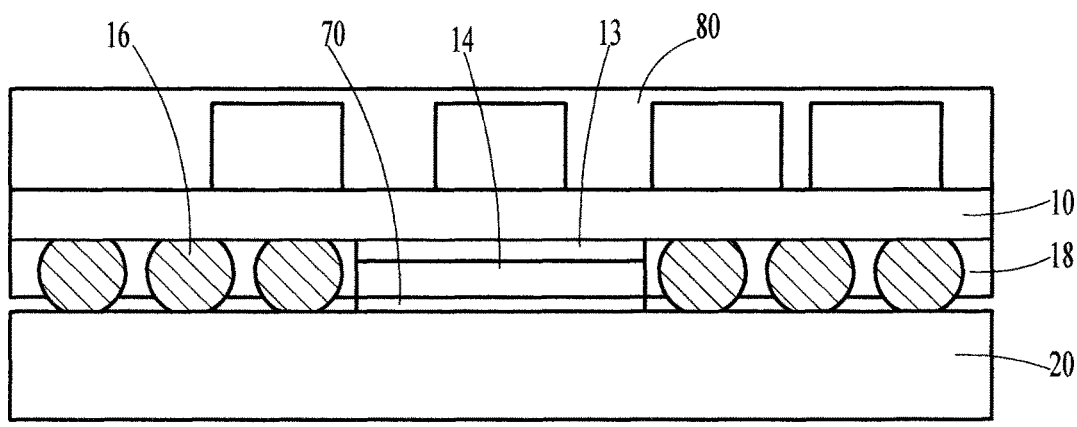
FIGS. 18-20 are cross-sectional representations of alternative System in Package (SiP) die-down packages of the present disclosure.
Figure 19:
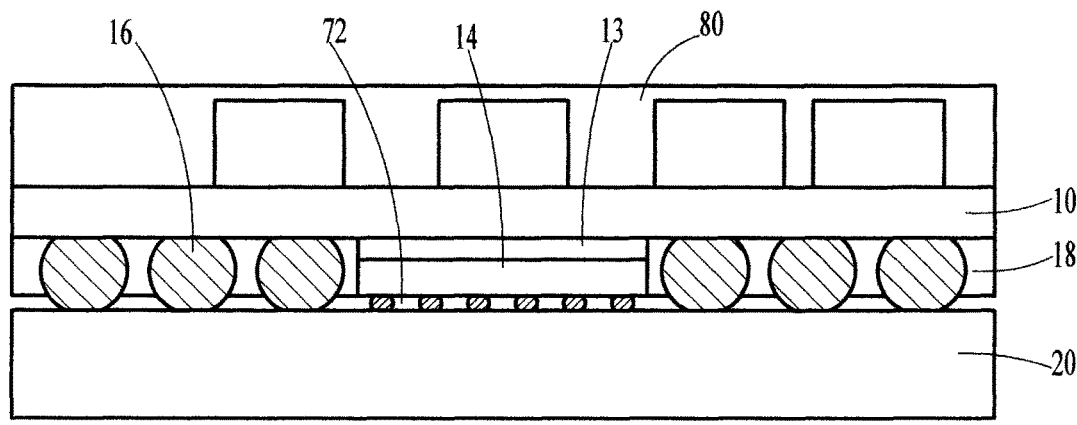
Figure 20:
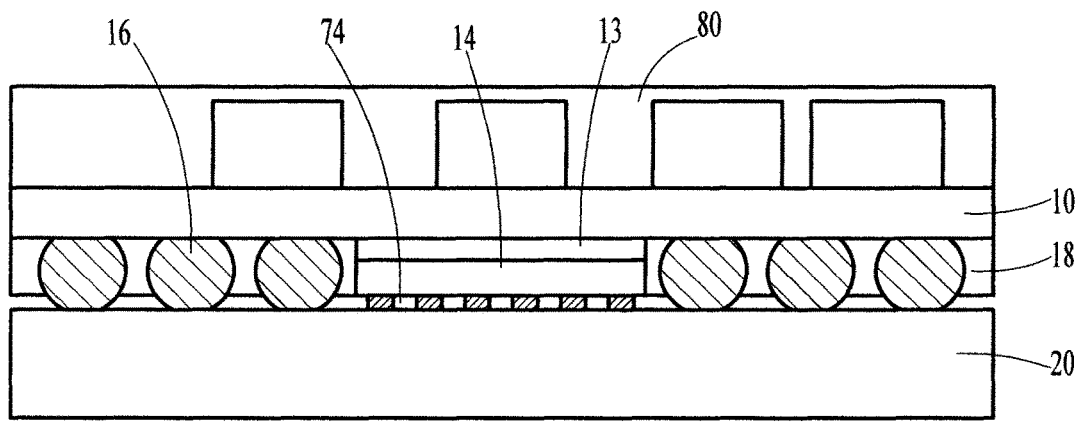

FIGS. 18-20 illustrate SiP packages. In FIG. 18, conductive material 70 fills the gap between the die 14 and the PCB 20 creating a second thermal path. The conductive material 70 is a paste or film style material such as a phase change material, for example. FIG. 19 illustrates a SiP where conductive material 72 in sphere shapes bridges the gap between the die and the PCB, creating a second thermal path. FIG. 20 illustrates a similar SiP where conductive material in pillar shapes 74 bridges the gap between the die and the PCB, creating a second thermal path. Molding compound 80 covers surface mount technology devices on substrate 10.

The process of the present disclosure provides a die-down package with multiple thermal paths for superior heat dissipation and, thus, enables higher power input with the same package size and structure. It can be used for any IC package that is an exposed die-down package. A thermal enhanced layer is provided between the die and the PCB, thus providing a second thermal path to transfer heat directly from the exposed die surface to the PCB. No heat spreader or other materials or devices are required to provide this extra heat dissipation. The thermal enahanced layer can be any material that will conduct heat.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. An integrated circuit package comprising:
an integrated circuit die attached to a substrate;
said substrate mounted on a printed circuit board (PCB) wherein there is a gap between a surface of said die facing said PCB and said PCB; and
a thermal enhanced layer in said gap wherein heat travels from said die through said thermal enhanced layer to said PCB and from said die to said substrate through connectors from said substrate to said PCB and wherein no heat spreader device is present in said package.

2. The package according to claim 1 wherein said package is a ball grid array package.

3. The package according to claim 1 wherein said package is a system in package.

4. The package according to claim 1 wherein said substrate is mounted on said PCB by solder joints.

5. The package according to claim 1 wherein said thermal enhanced layer is a phase change material that changes from a solid to a liquid phase upon application of heat and wherein said liquid phase phase change material fills said gap between said die and said PCB.

6. The package according to claim 1 wherein said thermal enhanced layer is:
a first epoxy forming a barrier around said die on said printed circuit board; and
a second epoxy within said barrier and filling said gap between said die and said PCB wherein said first epoxy has a higher viscosity than said second epoxy.

7. The package according to claim 1 wherein said thermal enhanced layer is an epoxy filling said gap between said die and said PCB.

8. The package according to claim 1 further comprising a plurality of through silicon vias through said die filled with a conductive material wherein said thermal enhanced layer is a conductive material joining said through silicon vias to said PCB.

9. The package according to claim 1 further comprising at least one copper pad in said PCB wherein said thermal enhanced layer contacts said at least one copper pad.

10. A method of fabricating an integrated circuit package comprising:
providing an integrated circuit die attached to a substrate;
mounting said substrate on a printed circuit board (PCB) wherein there is a gap between a surface of said die facing said PCB and said PCB; and
forming a thermal enhanced layer within said gap wherein heat travels 1) from said die to said substrate through connectors to said PCB and 2) from said die through said thermal enhanced layer to said PCB wherein no heat spreader device is present in said package.

11. The method according to claim 10 wherein said package is a ball grid array package.

12. The method according to claim 10 wherein said package is a system in package.

13. The method according to claim 10 wherein said connectors comprise solder joints.

14. The method according to claim 10 wherein said forming said thermal enhanced layer comprises:
applying a phase change material pad on a conductive pad on said PCB wherein heat applied during said mounting of said die to said PCB changes said phase change material from a solid to a liquid phase wherein said liquid phase phase change material fills said gap between said die and said PCB.

15. The method according to claim 10 wherein said forming said thermal enhanced layer comprises:
dispensing a first epoxy forming a barrier around said die on said printed circuit board; and
dispensing a second epoxy within said barrier and filling said gap between said die and said PCB wherein said first epoxy has a higher viscosity than said second epoxy.

16. The method according to claim 10 wherein said forming said thermal enhanced layer comprises:
dispensing an epoxy filling said gap between said die and said PCB.

17. The method according to claim 10 further comprising:
forming a plurality of through silicon vias through said die;
filling said through silicon vias with a conductive material; and
said forming said thermal enhanced layer comprises applying a conductive material joining said through silicon vias to said PCB.

18. The method according to claim 10 wherein said thermal enhanced layer comprises a conductive layer, conductive spheres, or conductive pillars.

* * * * *